United States Patent
Dupont et al.

(10) Patent No.: US 10,340,138 B2
(45) Date of Patent: Jul. 2, 2019

(54) ELECTRONIC DEVICE WITH A WIRE ELEMENT EXTENDING FROM AN ELECTROCONDUCTIVE LAYER COMPRISING ZIRCONIUM CARBIDE OR HAFNIUM CARBIDE

(71) Applicants: COMMISSARIAT A L'ENERGIE ATOMIQUE ET AUX ENERGIES ALTERNATIVES, Paris (FR); ALEDIA, Grenoble (FR)

(72) Inventors: Florian Dupont, Grenoble (FR); Benoit Amstatt, Grenoble (FR); Bérangère Hyot, Eybens (FR)

(73) Assignees: COMMISSARIAT A L'ENERGIE ATOMIQUE ET AUX ENERGIES ALTERNATIVES, Paris (FR); ALEDIA, Grenoble (FR)

( * ) Notice: Subject to any disclaimer, the term of this patent is extended or adjusted under 35 U.S.C. 154(b) by 0 days.

(21) Appl. No.: 15/532,260

(22) PCT Filed: Dec. 4, 2015

(86) PCT No.: PCT/EP2015/078640
§ 371 (c)(1),
(2) Date: Jun. 1, 2017

(87) PCT Pub. No.: WO2016/087634
PCT Pub. Date: Jun. 9, 2016

(65) Prior Publication Data
US 2017/0345652 A1 Nov. 30, 2017

(30) Foreign Application Priority Data
Dec. 5, 2014 (FR) ...................... 14 61965

(51) Int. Cl.
*H01L 21/02* (2006.01)
*B82Y 10/00* (2011.01)
(Continued)

(52) U.S. Cl.
CPC ........ *H01L 21/02491* (2013.01); *B82Y 10/00* (2013.01); *H01L 21/0254* (2013.01);
(Continued)

(58) Field of Classification Search
CPC ........... H01L 31/03044; H01L 31/1856; H01L 21/02603
See application file for complete search history.

(56) References Cited

U.S. PATENT DOCUMENTS

2005/0067935 A1* 3/2005 Lee ..................... H01J 1/3044
 313/309
2010/0314627 A1* 12/2010 Sung ................. H01L 21/02376
 257/77

(Continued)

FOREIGN PATENT DOCUMENTS

WO 2011/162715 A1 12/2011
WO 2014/064263 A2 5/2014

OTHER PUBLICATIONS

Songmuang et al., "From nucleation to growth of catalyst-free GaN nanowires on thin AlN buffer layer", Applied Physics Letters, vol. 91, 2007, 3 pages; in English; cited in the Specification.

(Continued)

*Primary Examiner* — Jay C Chang
*Assistant Examiner* — Mikka Liu
(74) *Attorney, Agent, or Firm* — Westerman, Hattori, Daniels & Adrian, LLP

(57) ABSTRACT

The electronic device comprises a substrate (1), at least one semiconductor wire element (2) formed by a nitride of a group III material and an electroconductive layer (3) inter- (Continued)

posed between the substrate (1) and said at least one semiconductor wire element (2). Said at least one semiconductor wire element (2) extends from said electroconductive layer (3), and the electroconductive layer (3) comprises a carbide of zirconium or a carbide of hafnium.

19 Claims, 3 Drawing Sheets

(51) Int. Cl.
*H01L 31/0352* (2006.01)
*H01L 31/0304* (2006.01)
*H01L 31/0392* (2006.01)
*H01L 31/18* (2006.01)
*H01L 33/00* (2010.01)
*H01L 33/06* (2010.01)
*H01L 33/12* (2010.01)
*H01L 33/32* (2010.01)
*H01L 33/18* (2010.01)
*H01L 29/06* (2006.01)

(52) U.S. Cl.
CPC .... *H01L 21/0262* (2013.01); *H01L 21/02381* (2013.01); *H01L 21/02433* (2013.01); *H01L 21/02516* (2013.01); *H01L 21/02603* (2013.01); *H01L 31/03044* (2013.01); *H01L 31/0392* (2013.01); *H01L 31/035227* (2013.01); *H01L 31/1852* (2013.01); *H01L 31/1856* (2013.01); *H01L 33/007* (2013.01); *H01L 33/06* (2013.01); *H01L 33/12* (2013.01); *H01L 33/18* (2013.01); *H01L 33/32* (2013.01); *H01L 29/0676* (2013.01); *Y02E 10/544* (2013.01); *Y02P 70/521* (2015.11)

(56) References Cited

U.S. PATENT DOCUMENTS

| | | |
|---|---|---|
| 2013/0221322 A1 | 8/2013 | Ohlsson |
| 2014/0120637 A1 | 5/2014 | Hyot et al. |
| 2014/0166101 A1* | 6/2014 | Myoung .......... H01L 31/02168 136/256 |
| 2015/0279672 A1 | 10/2015 | Hyot et al. |

OTHER PUBLICATIONS

International Search Report and Written Opinion dated Feb. 19, 2016 issued in corresponding application No. PCT/EP2015/078640; w/ English partial translation and partial machine translation (21 pages).

* cited by examiner

ELECTRONIC DEVICE WITH A WIRE ELEMENT EXTENDING FROM AN ELECTROCONDUCTIVE LAYER COMPRISING ZIRCONIUM CARBIDE OR HAFNIUM CARBIDE

TECHNICAL FIELD OF THE INVENTION

The invention relates to the field of electronics and, more particularly, of opto-electronics in the framework of electronic devices using light-emitting diode(s) or using photovoltaic cell(s).

The invention is more particularly aimed at an electronic device comprising a substrate, at least one semiconductor wire element composed of a nitride of a group III material and an electroconductive layer interposed between the substrate and said semiconductor wire element, said at least one semiconductor wire element extending from the electroconductive layer.

PRIOR ART

In the field of the growth of wire elements made from a nitride of a material from group III of the periodic table of the elements, a known solution is to use layers known as nucleation layers in order to promote said growth. The materials conventionally used as nucleation layers are AlN (aluminum nitride), TiN (titanium nitride), or else nitrides of transition metals.

The document "From nucleation to growth of catalyst-free GaN nanowires on thin AlN buffer layer" by R. Sondmuang et al. published in 2007, in Appl. Phys. Lett. 91, indeed describes the growth of nanowires starting from a layer of AlN. In the case of AlN, the layers are highly resistive and do not allow, in the case of a light-transmitting device, the injection of carriers via the base of the wire elements to be provided and/or the wire elements to be electrically connected together.

In the case of nitrides of transition metals, the depositions are generally carried out in two steps: a first metal deposition step, followed by a step for annealing under a nitriding gas, which allows a transition metal nitride to be created. This is notably what is described in the document WO2014/064263. These two steps then lead to an increase in the duration and in the costs of production.

The aforementioned documents do not solve both the problem of the injection of the carriers via the base of wire elements and the problem of the formation of the nucleation layer in a single step, notably for the fabrication of light-transmitting optoelectronic devices using nano- or micro-wires.

The document WO2011/162715 describes the use of a buffer layer for the growth of a nitride of a III-V compound.

Furthermore, in this competitive field, it is also advantageous to find novel alternatives to the known electronic devices.

SUBJECT OF THE INVENTION

The aim of the present invention is to provide a solution which overcomes, completely or in part, the drawbacks listed hereinabove.

This goal is approached in that the electroconductive layer comprises a carbide of zirconium or a carbide of hafnium.

Notably, the thickness of the electroconductive layer is in the range between 3 nm and 50 nm.

Advantageously, the electroconductive layer exhibits a crystallinity such that the crystallites of the latter each have a dimension, in the direction of the thickness of said electroconductive layer, of less than half the thickness of said electroconductive layer.

The device may comprise a light-emitting diode or a photovoltaic cell, of which at least a part is formed by said at least one semiconductor wire element.

The substrate may be a silicon substrate.

The invention also relates to a method of fabrication of an electronic device comprising the following steps:
  supplying a substrate,
  forming an electroconductive layer on the substrate, the electroconductive layer formed comprising a carbide of zirconium and a carbide of hafnium,
  forming at least one semiconductor wire element composed of a nitride of a group III material by growth starting from said electroconductive layer.

Notably, the method comprises, prior to the step for formation of the electroconductive layer, a step for de-oxidation of the substrate notably implemented by an argon plasma.

In particular, the step for supplying the substrate is such that the substrate supplied is made of silicon and exhibits a [100] crystallographic orientation.

Notably, the electroconductive layer formed exhibits a face-centered cubic crystalline structure and has a [111] crystallographic orientation.

The step for formation of the electroconductive layer may comprise a step for deposition of said electroconductive layer using a target composed of zirconium carbide when the electroconductive layer to be formed comprises zirconium carbide, or composed of hafnium carbide when the electroconductive layer to be formed comprises hafnium carbide.

Notably, the step for formation of said at least one semiconductor wire element comprises a step for growth, notably by epitaxy, of at least one wire of a nitride of a group III material. In this framework, the growth step may be preceded by a step for raising the temperature of an epitaxy reaction chamber in which the substrate is placed, on which is formed the electroconductive layer, said step for raising the temperature being carried out under a flow of nitrogen with a constant temperature ramp, notably equal to 1.25° C./s, rising from an initial temperature to an epitaxy temperature higher than said initial temperature; notably, the epitaxy temperature is equal to 1000° C.

According to one embodiment, the step for formation by growth of said at least one semiconductor wire element is carried out starting from the electroconductive layer formed, whereas said electroconductive layer has not been subjected to an annealing after its formation.

According to one embodiment, the method comprises a step for functionalization of said at least one semiconductor wire element in order to form a light-emitting diode or a photovoltaic cell.

Notably, the step for formation of the electroconductive layer is such that the electroconductive layer formed has a thickness in the range between 3 nm and 50 nm.

BRIEF DESCRIPTION OF THE DRAWINGS

Other advantages and features will become more clearly apparent from the description that follows of particular embodiments of the invention presented by way of non-limiting examples and shown in the appended drawings, in which.

DESCRIPTION OF PREFERRED EMBODIMENTS OF THE INVENTION

The device and the method described hereinafter differ from the prior art notably in that they use an electroconductive layer comprising hafnium carbide or zirconium carbide from which at least one semiconductor wire element extends. Zirconium carbide or hafnium carbide are good candidates because they allow an electroconductive layer to be formed, they have a crystallographic structure compatible with the epitaxy of wire elements, notably of gallium nitride, and they exhibit an enhanced thermal stability with respect to nitrides of hafnium and of zirconium thus allowing a greater flexibility in the fabrication process.

In the present description, a semiconductor wire element may be a 'microwire' or a 'nanowire'. For example, the semiconductor wire element preferably means a three-dimensional structure of elongated shape whose longitudinal dimension is equal to, preferably greater than, at least one times the transverse dimension or dimensions, preferably at least five times and even more preferably at least ten times. The transverse dimension or dimensions are in the range between 5 nm and 2.5 µm. In some embodiments, the transverse dimensions may be less than or equal to around 1 µm, preferably in the range between 100 nm and 300 nm. In some embodiments, the height of each wire element may be greater than or equal to 500 nm, preferably in the range between 1 µm and 50 µm.

In such a manner as to be applicable to everything that is said in the present description, the semiconductor wire element may be formed by a nitride of a material of group (also known as column) III. A "group III material" is understood to mean one, or more, chemical elements from group III of the periodic table of the elements. When the material is formed by several chemical elements from group III, the material is then an alloy of group III chemical elements. Preferably, the wire element is formed by GaN or InGaN.

Figure 1:
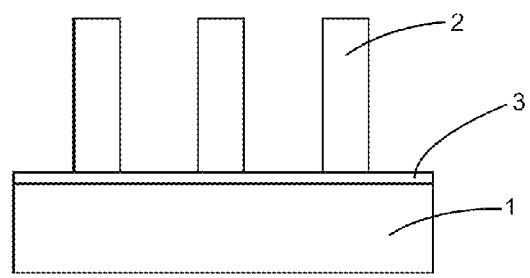
FIG. 1 is a schematic view of a device according to one embodiment of the invention.

FIG. 1 illustrates an electronic device comprising a substrate 1, at least one semiconductor wire element 2 formed by a nitride of a group III material and an electroconductive layer 3 interposed between the substrate 1 and said at least one semiconductor wire element 2. The electroconductive layer 3 comprises a carbide of zirconium or a carbide of hafnium. Said at least one wire element 2 extends from said electroconductive layer 3. In other words, said at least one semiconductor wire element 2 comprises one longitudinal end in physical contact with the electroconductive layer 3, and notably its other longitudinal end is situated remotely from said electroconductive layer 3. In particular, the electroconductive layer 3 is formed directly on the substrate 1.

In the present description, where reference is made to "at least one semiconductor wire element 2", it is clear that, in the framework of the device and of the method described, everything that is applicable to at least one semiconductor wire element 2 may be applied, where they are present, to each semiconductor wire element 2 from a plurality of semiconductor wire elements 2 (FIG. 1) extending from said electroconductive layer 3.

The electrical conduction of the electroconductive layer 3 enables an electrical function such as the participation in the injection of charge carriers into said, or in the collection of charge carriers from said, at least one semiconductor wire element 2. The use of zirconium carbide or of hafnium carbide allows this function of electrical conductivity to be fulfilled.

When the electronic device comprises a plurality of semiconductor wire elements 2 (FIG. 1), the electroconductive layer 3 is advantageously common to each of the semiconductor wire elements 2. In other words, the end of each semiconductor wire element 2 is then in electrical contact with said electroconductive layer 3.

Furthermore, this electroconductive layer 3 comprising zirconium carbide and hafnium carbide has additional functions within the framework of the method of fabrication of the electronic device since it allows the growth of one or more semiconductor wire elements 2. Indeed, such an electroconductive layer 3 exhibits, aside from its electrical conductivity, a crystalline structure compatible with the epitaxy of at least one semiconductor wire element 2, notably when the latter is formed from a nitride of an element from column (also called group) III of the periodic table. Furthermore, in contrast to the nitrides of transition metals of the prior art, the two materials provided in the framework of the present invention (zirconium carbide and hafnium carbide) offer the advantage of being able to be easily deposited in a single step, and of allowing, if desired, a nucleation of semiconductor wire elements 2 without the use of an intermediate mask for localizing nucleation regions.

Accordingly, the invention also relates to a method of fabrication of an electronic device, notably such as previously described, comprising the following steps: supplying a substrate 1; forming an electroconductive layer 3 on the substrate 1, the electroconductive layer 3 formed comprising a carbide of zirconium or a carbide of hafnium; forming at least one semiconductor wire element 2, composed of a nitride of a group III material, by growth starting from said electroconductive layer 3.

The electroconductive layer 3 described in the present description is advantageously composed of a carbide of zirconium or a carbide of hafnium, in other words it will not comprise any other chemical elements. In other words, the electroconductive layer 3 can comprise solely a carbide of hafnium or a carbide of zirconium. Alternatively, other chemical elements could be present within the electroconductive layer 3 but at a negligible level (for example, less than a concentration of 1%). According to a particular implementation, the metal carbide (chosen from between zirconium carbide and hafnium carbide) may be denoted $M_xC_y$, with M representing the metal used (zirconium or hafnium), C the carbon component, x and y representing the stœchiometric conditions of the metal carbide. In the ideal case, x and y are equal to 1. Alternatively, by fixing x at 1, y can vary to a certain extent while at the same time conserving a stable state of the metal carbide; this variation is also referred to as the stœchiometric shift and is denoted $\Delta N$. In particular, the variation may be in coherence with the phase diagrams, for example ZrC may contain 38% to 50% in atomic percentage of carbon and HfC can contain from 40% to 49% atomic percent of carbon. Under these particular stœchiometric conditions, the electroconductive layer 3 allows the various functions previously listed to be fulfilled.

According to one embodiment, the thickness of the electroconductive layer 3 is in the range between 3 nm and 50 nm (and more particularly from 5 nm to 20 nm, limits included). This range of thickness notably allows the various functions of the electroconductive layer 3 listed to be fulfilled, in the framework of the device and in the framework of the method of fabrication (in this case, the step for formation of the electroconductive layer 3 may be such that the electroconductive layer 3 formed has a thickness in the range between 3 nm and 50 nm), under very satisfactory conditions although outside of this range the functions may still be fulfilled but in a less satisfactory manner.

According to the embodiment described immediately hereinabove, where the thickness of the electroconductive layer 3 is in the range between 5 nm and 30 nm or, more particularly, between 5 nm and 20 nm, it has been established that the electrical conduction of the electroconductive layer 3 was satisfactory and that, in the framework of the method, the ranges of thickness of the invention allowed a better growth of semiconductor wire element(s). In particular, the density (number of wire elements that are able to grow on a given surface) and the verticality of the wire elements obtained are improved.

Generally speaking, the substrate 1 may be a silicon substrate, and the electroconductive layer 3 may be formed directly on the substrate 1.

Advantageously, the step for supplying the substrate 1 is such that the substrate supplied 1 is a silicon substrate with a [100] crystallographic orientation, notably at the surface on which the electroconductive layer 3 will be formed. This [100] crystallographic orientation of the silicon substrate 1 allows the formation, notably by deposition, of the electroconductive layer 3 to be promoted according to a crystallographic orientation compatible with a vertical growth of said at least one semiconductor wire element 2. The verticality of a semiconductor wire element 2 is given with respect to a plane defining the horizontal and parallel to the planes respectively including the substrate 1 and the electroconductive layer 3. In the framework of the device and of the method, said at least one semiconductor wire element 2 is preferably vertical.

In the present description, a given crystallographic orientation is considered as parallel to the perpendicular to a working surface, notably a planar surface, of the substrate 1. The working surface of the substrate 1 is notably that on which the electroconductive layer 3 is formed, notably by deposition.

According to one embodiment, the method comprises, prior to the step for formation of the electroconductive layer 3, a step for de-oxidation of the substrate 1, notably implemented by an argon plasma. This de-oxidation allows the native oxide to be removed from the silicon, notably from the working surface of the substrate 1, so as to ensure a crystallographic orientation adapted to the desired crystallographic orientation of the electroconductive layer 3. This optional de-oxidation step may be carried out in a chamber for deposition of the electroconductive layer 3 by the application of the argon plasma.

Generally speaking, the step for formation of the electroconductive layer 3 on the substrate 1 may be carried out by PVD (for "Physical Vapor Deposition"). This deposition is notably carried out from a target composed of the material that it is sought to deposit (zirconium carbide or hafnium carbide). Thus, the step for formation of the electroconductive layer 3 may comprise a step for deposition of said electroconductive layer using a target composed of zirconium carbide when the electroconductive layer 3 to be formed comprises zirconium carbide, or composed of hafnium carbide when the electroconductive layer 3 to be formed comprises hafnium carbide. In other words, as a result of the step for formation of the electroconductive layer 3, the deposited layer directly comprises (or is directly formed by) zirconium carbide or hafnium carbide, thus limiting the number of technological steps for the formation of the electroconductive layer 3 intended for the nucleation of wire element(s). The techniques for deposition of this electroconductive layer 3 are conventional; for example, this deposition may be carried out at ambient temperature or otherwise. "Deposition at ambient temperature" is understood to mean that the substrate is not purposely heated notwithstanding the normal rise in temperature due to the deposition.

The crystallinity of the electroconductive layer 3 once formed, notably by deposition, is notably low with respect to the crystallinity of a layer of equivalent thickness formed by the metal chemical element (hafnium or zirconium) only. Nevertheless, surprisingly, it has been observed that the growth of said at least one semiconductor wire element 2 on this electroconductive layer 3 directly after its deposition still allowed results comparable to those of a layer whose crystallinity would have been higher. "Growth directly after deposition" is understood to mean that the growth of said at least one semiconductor wire element 2 may be carried out starting from the electroconductive layer 3 without any additional treatment or processing of the latter in order to modify it. Notably, the growth of said at least one semiconductor wire element 2 is carried out just after the deposition of the electroconductive layer 3 and without carrying out a step for annealing the deposited electroconductive layer 3 which would have had the goal of increasing its crystallinity. In other words, the step for formation by growth of said at least one semiconductor wire element 2 may be carried out starting from the electroconductive layer 3 formed, whereas the latter has not been subjected to an annealing after its formation, notably by deposition. Thus, quite unexpectedly, the electroconductive layer 3 may be used 'as is' for the epitaxy (in other words, the growth) of said at least one semiconductor wire element 2.

Figure 2:
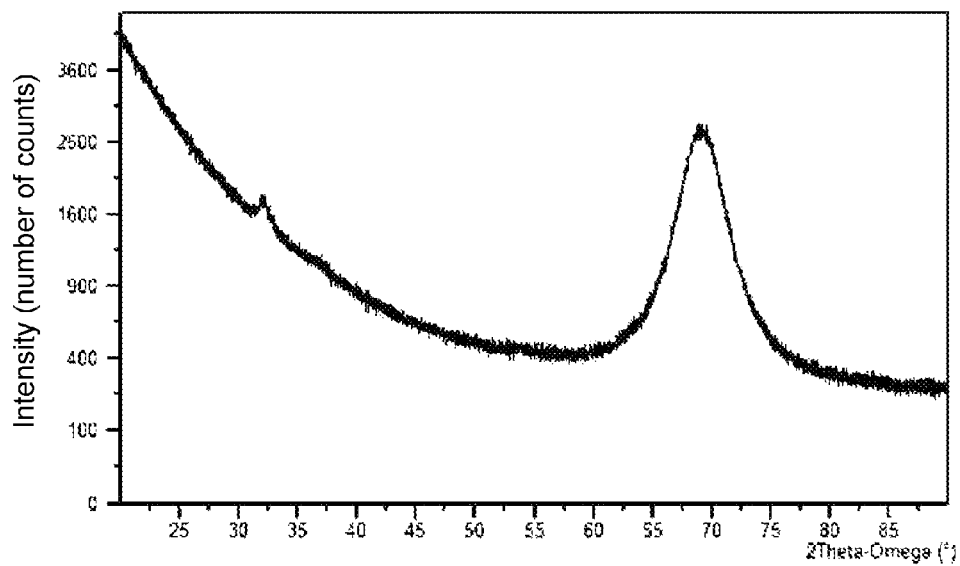
FIG. 2 is a graph representing an intensity in number of counts from an X-ray diffraction study carried out on a layer of ZrC.

In the present description, low crystallinity' is understood to mean that the size of the crystals of the electroconductive layer 3 deposited is less than the thickness of the deposited layer divided by two. The thickness of the deposited layer is defined along the normal with respect to the aforementioned working surface. In other words, the electroconductive layer 3 exhibits a crystallinity such that the crystallites of the latter each have a dimension, in the direction of the thickness of the electroconductive layer 3 (in other words measured perpendicularly to the substrate 1), less than the thickness of said electroconductive layer 3 divided by two. For example, the dimension is preferably less than 10 nm. The limitation on the dimension described in the present paragraph is one pre-conceived idea dispelled, and indeed, the tendency would be to wish to increase the size of the grains (crystallites) in order to promote the epitaxy of the wire element or elements. Surprisingly, without increasing the size of the crystallites in the direction of the thickness of the layer 3, the growth of the wire element or elements has remained more than satisfactory. Such a limitation in the size of grains allows the formation to be facilitated by avoiding a dedicated step for increasing the size of the grains. According to one preferred embodiment, the electroconductive layer 3 formed has a face-centered cubic crystalline structure and has a [111] crystallographic orientation. This allows the promotion of the nucleation and the growth of the semiconductor wire elements 2, in particular when they are based on a group III nitride, notably gallium nitride. FIG. 2 illustrates an X-ray diffraction study carried out on a layer of zirconium carbide with a thickness of 20 nm produced by PVD deposition on a silicon substrate oriented in a manner such as previously described, this deposition exhibiting a structure according to said preferred embodiment since a diffraction peak is indeed observed at 32.0° which is associated with [111] oriented zirconium carbide (the diffraction peak at 69° is that associated with the silicon substrate).

One additional advantage of the use of an electroconductive layer comprising zirconium or hafnium carbide is that the growth of said at least one semiconductor wire element 2 does not cause a silicidation as would be the case if the layer were a nitride instead of the carbide. Accordingly, the step for deposition of the electroconductive layer 3 does not need to take into account this silicidation in the calculation of the thickness to be deposited with a view to ensuring the electrical conduction.

According to one embodiment, the step for formation of said at least one semiconductor wire element 2 comprises a step for growth, notably by epitaxy, of at least one wire of a nitride of a group III material, notably of gallium nitride.

Epitaxy is a technique for oriented growth well known to those skilled in the art.

More particularly, the step for formation by growth of said at least one semiconductor wire element 2 may implement an epitaxy of gallium nitride carried out in an epitaxy reactor, for example an epitaxy of the MOCVD type (acronym used in the field for "Metal-Organic Chemical Vapor Deposition").

After growth, wire elements have been observed of the GaN type oriented along their 0002 axis, despite the low initial crystallinity of the nucleation layer formed by the electroconductive layer 3.

In particular, the growth step, notably by epitaxy, is preceded by a step for raising the temperature of an epitaxy reaction chamber in which the substrate 1 is placed, on which the electroconductive layer 3 is formed, said step for raising the temperature being carried out under a flow of nitrogen with a constant temperature ramp, notably equal to 1.25° C./s, rising from an initial temperature toward an epitaxy temperature higher than the initial temperature; the epitaxy temperature is notably equal to 1000° C. The constant temperature ramp may be in the range between 0.1° C./s and 20° C./s, and more particularly between 0.5° C./s and 3° C./s. In other words, the notion of constant temperature ramp corresponds to the fact that, between the initial temperature and the epitaxy temperature, the current temperature varies in a monotonically increasing manner. Notably, this rise in temperature is applied in such a manner as not to cause an annealing of the electroconductive layer 3 formed, nor a nitridation which could damage the surface of the electroconductive layer 3 allowing the nucleation and the growth of said at least one semiconductor wire element 2. The epitaxy temperature, although preferably equal to 1000° C., may be in the range between 900° C. and 1100° C., and more particularly between 950° C. and 1050° C.

The step for raising the temperature described hereinabove allows it to remain well below the crystallization annealing temperature of the electroconductive layer 3, and to do so for a time that is short with respect to the normal duration of such an annealing step. Indeed, the material of the electroconductive layer 3 does not then have sufficient energy to be able to initiate a phase of growth of its crystalline domains. Accordingly, in the course of the epitaxy of the wire element(s), this allows dimensions of crystallites in the direction of the thickness of the electroconductive layer 3 to be conserved such as previously described.

Figure 3:
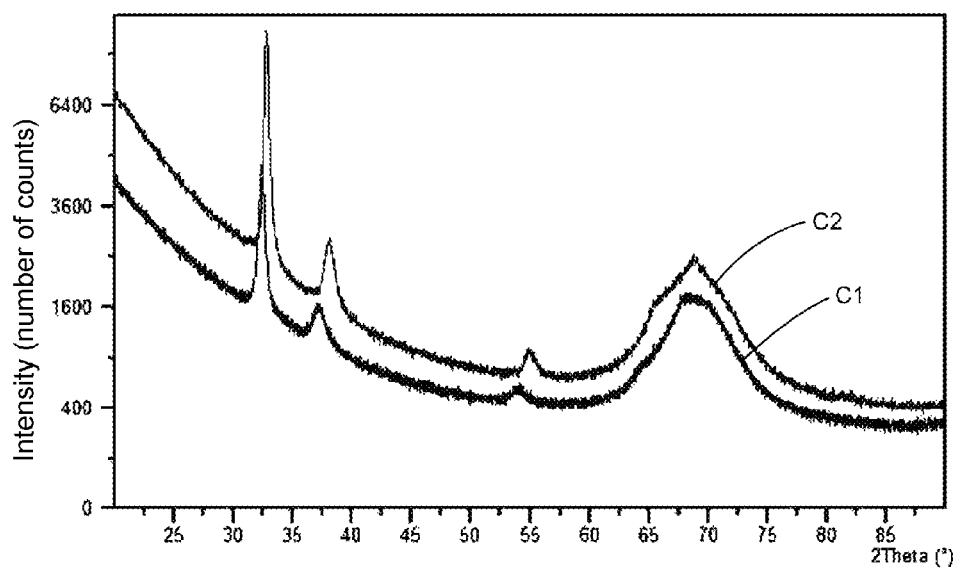
FIGS. 3 and 4 are graphs representing an intensity in number of counts from an X-ray diffraction study carried out on the same layer of ZrC before and after processing of the latter.
Figure 4:
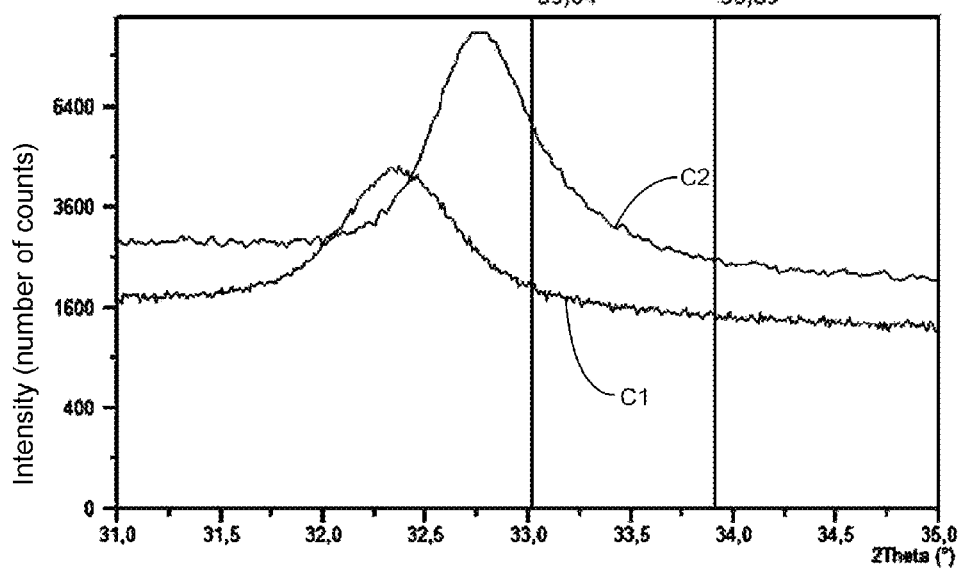

The fact that the crystalline structure of the electroconductive layer 3 has not been modified during the pre-epitaxy step for raising the temperature has been established experimentally by subjecting an experimental layer of ZrC to a pre-epitaxy step for raising the temperature in the presence of nitrogen $N_2$, and, potentially, ammonia $NH_3$. The conditions of flows and of pressures of the gases used are conventional conditions. For example, the epitaxy chamber may be set at a pressure that varies between 100 mbar and 400 mbar or between 100 mbar and 1000 mbar. As regards the gas flow, this may vary between 14000 sccm and 20000 sccm. The thickness of the experimental layer deposited is 100 nm in order to obtain an X-ray diffraction signal more intense than in the preferred range between 3 nm and 50 nm, thus allowing the structure and the crystallinity of the experimental layer to be better analyzed. The experimental layer of zirconium carbide deposited by PVD, then having undergone the pre-epitaxy phase of increasing temperature under a nitriding atmosphere, is subsequently characterized by X-ray diffraction. FIG. 3 shows a first curve C1 corresponding to an X-ray diffraction measurement carried out on the experimental layer prior to the step for raising the temperature, and a second curve C2 corresponding to an X-ray diffraction measurement carried out on the experimental layer after the step for raising the temperature. These two curves C1, C2 allow it to be identified that the experimental layer exhibits an FCC (face-centered cubic) structure of zirconium carbide with a texture of the 111 type (peak situated at 32°). After the step for raising the temperature under a nitriding atmosphere, the FCC structure of the zirconium carbide has not been modified and still has a pronounced 111 texture (where the slight shift after peaks 111 and 200 may be due to a relaxation of the layer). FIG. 4 illustrates a diffraction study where there are, in a more detailed manner, a first curve C1 corresponding to an X-ray diffraction measurement carried out on the experimental layer prior to the step for raising the temperature, and a second curve C2 corresponding to an X-ray diffraction measurement carried out on the experimental layer after the step for raising the temperature, the vertical lines showing the theoretical positions of the diffraction peaks of zirconium carbide and of zirconium nitride. It can clearly be seen from FIG. 4 that the FCC structure of the zirconium carbide can never be confused with the FCC structure of the zirconium nitride. This therefore shows that the later epitaxy of the wire elements, notably made of GaN, really does take place on a material having a crystalline structure of zirconium carbide and not on a material having a structure of the zirconium nitride type.

Figure 5:
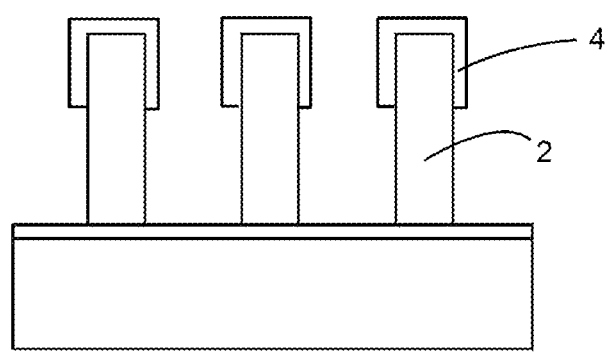
FIG. 5 illustrates the device in FIG. 1 after functionalization.

The electronic device such as described may be used to form light-emitting diodes or photovoltaic cells. Notably, the semiconductor wire element 2 may form all or part of a junction designed to emit light, or alternatively to sense it. When the semiconductor wire element 2 is made of gallium nitride, it can notably allow an emission in blue wavelengths or in the entirety of the spectrum. Thus, generally speaking, the electronic device may comprise a light-emitting diode, or a photovoltaic cell, of which at least a part is formed by said at least one semiconductor wire element 2. In the framework of the method of fabrication of the electronic device, the latter may comprise a step for functionalization of said at least one semiconductor wire element 2 in order to form a light-emitting diode or a photovoltaic cell. According to one particular example, said at least one semiconductor wire element 2 has an electrical doping of the P or N type, and it is, at least in part, covered, with or without interposition of an active layer (not shown) comprising for example quantum wells, by a shell 4 (FIG. 5) of a semiconductor material with an N or P electrical doping (with a doping opposite to that of the semiconductor wire element 2) in such a manner as to form a P-N junction of a light-emitting diode or of a photovoltaic cell. It goes without saying that this example is not limiting and those skilled in the art will be able to implement other functionalizations.

One additional advantage of the electroconductive layer 3 comprising zirconium carbide or hafnium carbide is that it is resistant to process recipes allowing the etching of a mask of $SiO_2$ as opposed to nitride layers which are more easily etched during the etch process. Accordingly, it is then possible to use, on the electronic device, further depositions of masks of $SiO_2$ which may be etched in an appropriate manner without damaging the function of electrical conductivity of the layer 3. Alternatively, although it is advantageous to allow the growth of the semiconductor wire elements 2 directly on the electroconductive layer 3 without use of a mask formed on the latter, it is possible to form a mask of $SiO_2$ with openings so as to form preferential growth sites for the semiconductor wire elements without the formation of this mask degrading the layer 3 formed.

According to one embodiment, the electroconductive layer 3 is such that it is reflecting for light emitted by the electronic device where said at least one semiconductor wire element 2 is located. In other words, it can form a mirror, which is advantageous when the device is designed to produce light in a direction opposite to the substrate.

Alternatively, the production of the light emitted by the electronic device at said at least one semiconductor wire element 2 may take place through the substrate 1 which is then transparent to the emitted light, just like the electroconductive layer 3.

The invention claimed is:

1. An electronic device comprising:
   a substrate made of silicon,
   at least one semiconductor wire element formed by a nitride of a group III material, and
   an electroconductive layer interposed between the substrate and the at least one semiconductor wire element,
   wherein the electroconductive layer is formed directly on the substrate,
   wherein the at least one semiconductor wire element extends from the electroconductive layer, and
   wherein the electroconductive layer comprises a carbide of zirconium or a carbide of hafnium.

2. The device as claimed in claim 1, wherein a thickness of the electroconductive layer is in a range of from 3 nm to 50 nm.

3. The device as claimed in claim 1, wherein the electroconductive layer exhibits a crystallinity so that crystallites of the electroconductive layer each have a dimension, in a thickness of the electroconductive layer, less than half the thickness of the electroconductive layer.

4. The device as claimed in claim 1, comprising a light-emitting diode of which at least a part is formed by the at least one semiconductor wire element.

5. A method of fabrication of an electronic device comprising:
   providing a substrate,
   forming an electroconductive layer on the substrate, the electroconductive layer formed comprising a carbide of zirconium or a carbide of hafnium, and
   forming at least one semiconductor wire element composed of a nitride of a group III material by growth starting from the electroconductive layer,
   so as to obtain the electronic device as claimed in claim 1.

6. The method as claimed in claim 5, comprising, prior to the forming of the electroconductive layer, performing deoxidation of the substrate.

7. The method as claimed in claim 6, wherein the deoxidation of the substrate is implemented by an argon plasma.

8. The method as claimed in claim 5, wherein the substrate provided is made of silicon and exhibits a [100] crystallographic orientation.

9. The method as claimed in any claim 5, wherein the electroconductive layer formed exhibits a face-centered cubic crystalline structure and has a [111] crystallographic orientation.

10. The method as claimed in claim 5, wherein the forming of the electroconductive layer comprises performing deposition of the electroconductive layer using a target composed of zirconium carbide so that the electroconductive layer formed comprises zirconium carbide.

11. The method as claimed in claim 5, wherein the forming of the at least one semiconductor wire element comprises growing at least one wire of a nitride of a group III material.

12. The method as claimed in claim 11, wherein the growing is preceded by raising the temperature of an epitaxy reaction chamber in which the substrate is placed, on which the electroconductive layer is formed, the raising of the temperature being carried out under a flow of nitrogen with a constant temperature ramp, rising from an initial temperature to an epitaxy temperature higher than the initial temperature.

13. The method as claimed in claim 12, wherein the constant temperature ramp is equal to 1.25° C/s.

14. The method as claimed in claim 12, wherein the epitaxy temperature is equal to 1000° C.

15. The method as claimed in claim 5, wherein the forming by growth of the at least one semiconductor wire element is carried out starting from the electroconductive layer formed, wherein the electroconductive layer has not been subjected to an annealing after being formed.

16. The method as claimed in claim 5, comprising performing functionalization of the at least one semiconductor wire element in order to form a light-emitting diode or a photovoltaic cell.

17. The method as claimed in claim 5, wherein the forming of the electroconductive layer is so that the electroconductive layer formed has a thickness in a range of from 3 nm to 50 nm.

18. The method as claimed in claim 5, wherein the forming of the electroconductive layer comprises performing deposition of the electroconductive layer using a target composed of hafnium carbide, so that the electroconductive layer formed comprises hafnium carbide.

19. The device as claimed in claim 1, comprising a photovoltaic cell of which at least a part is formed by the at least one semiconductor wire element.

* * * * *